United States Patent
Hsu et al.

(10) Patent No.: US 9,958,477 B2
(45) Date of Patent: May 1, 2018

(54) TESTING MACHINE AND OPERATION METHOD THEREOF

(71) Applicant: MPI Corporation, Hsinchu County (TW)

(72) Inventors: Yu-Hsun Hsu, Hsinchu County (TW); Ban-Ban Lim, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 87 days.

(21) Appl. No.: 15/064,607

(22) Filed: Mar. 9, 2016

(65) Prior Publication Data

US 2016/0266168 A1    Sep. 15, 2016

(30) Foreign Application Priority Data

Mar. 11, 2015 (TW) .............................. 104107766 A

(51) Int. Cl.
*G01R 31/20* (2006.01)
*G01R 1/067* (2006.01)
*G01R 31/26* (2014.01)

(52) U.S. Cl.
CPC ..... *G01R 1/06705* (2013.01); *G01R 31/2601* (2013.01); *G01R 31/2635* (2013.01)

(58) Field of Classification Search
CPC .. G01R 31/2887; G01R 31/2891; G01R 3/00; G01R 1/07314; G01R 1/06772; G01R 1/07307; G01R 1/07342; G01R 31/2893; G01R 1/06711; G01R 1/07357; G01R 1/07378; G01R 1/0408; G01R 1/06794; G01R 35/005; G01R 1/04; G01R 1/073; G01R 31/2886; G01R 1/07392; G01R 21/00; G01R 31/2832; G01R 31/2851; G01R 31/309; G01R 1/025; G01R 1/06727; G01R 1/06738; G01R 1/06766; G01R 1/06788; H01R 13/2414; H01R 2201/20; H01R 12/714; H01R 13/2428; H01R 13/22; G06F 21/554; G06F 21/566
See application file for complete search history.

(56) References Cited

U.S. PATENT DOCUMENTS 6,501,260 B1 * 12/2002 Hu ..................... H01S 5/0014
324/750.2
7,250,782 B2 * 7/2007 Romanov .......... G01R 1/06705
324/750.18

(Continued)

*Primary Examiner* — Vinh Nguyen
(74) *Attorney, Agent, or Firm* — CKC & Partners Co., Ltd.

(57) ABSTRACT

A test machine includes a base, a testing platform, a probe platform, a control lever, a temporary positioning mechanism and a damper. The testing platform connects with the base and carries a device under test. The probe platform connects with the base and moves along a longitudinal direction. The probe platform connects with a probe. The control lever connects with the base and the probe platform which is driven by the control lever to move along the longitudinal direction. The temporary positioning mechanism connects with the control lever and temporarily holds the probe platform and the control lever at a specific position. The damper connects with the base. When a distance between the probe and the DUT is shorter than a buffering distance, the damper abuts against the control lever or the probe platform to reduce a velocity of the probe moving towards the DUT.

14 Claims, 8 Drawing Sheets

(56) References Cited

U.S. PATENT DOCUMENTS

| | | | | |
|---|---|---|---|---|
| 7,859,281 B2* | 12/2010 | Romanov | .......... | G01R 1/06794 324/754.07 |
| 8,081,008 B2* | 12/2011 | Liang | .................... | G01R 27/04 324/754.11 |
| 8,513,968 B2* | 8/2013 | Li | ..................... | G01R 31/2808 324/72.5 |
| 2014/0241820 A1* | 8/2014 | Berg | ..................... | B23Q 17/20 408/2 |

* cited by examiner

TESTING MACHINE AND OPERATION METHOD THEREOF

RELATED APPLICATIONS

This application claims priority to Taiwan Application Serial Number 104107766, filed Mar. 11, 2015, which is herein incorporated by reference.

BACKGROUND

Technical Field

The present disclosure relates to a testing machine. More particularly, the present disclosure relates to a testing machine which allows the probe to touch the device under test (DUT) slowly.

Description of Related Art

In experiments or researches, the testing machines utilized for testing an electronic element can be generally configured to a manual operation, no matter whether the testing machines are fully automatic, semi-automatic or manually operated. Thus, the operation of the testing machines can be more flexible.

Traditionally, a testing operator operates a lever to move up or down a lifting platform disposed with a probe, such that the probe can move close to or away from a device under test (DUT). If the testing operator operates the lever with an unstable speed, the raising or lowering of the lifting platform will also be unstable correspondingly. In other occasions, when the lifting platform moves too fast, a large impact may be generated when the probe touches the device under test. This may cause the damage to either the probe or the device under test.

Therefore, the method to make the probe touch the device under test precisely and make the damage to either the probe or the device under test become uneasy, is an important issue in the industry.

SUMMARY

A technical aspect of the present disclosure provides a testing machine, in which the velocity of a probe touching a device under test is restricted by a damper, such that the probe can slowly but precisely touch the device under test, and the possibility of damage to the probe and the device under test when touching each other due to too heavy an impact is minimized.

According to an embodiment of the present disclosure, a testing machine includes a base, a testing platform, a probe platform, a control lever, a temporary positioning mechanism and a damper. The testing platform is connected with the base. The testing platform being configured to carry a device under test (DUT). The probe platform is connected with the base. The probe platform is able to move along a longitudinal direction relative to the testing platform, and the probe platform is configured to connect with at least one probe corresponding to the device under test. The control lever is connected with the base and the probe platform. Through operating the control lever, the probe platform is driven by the control lever to move along the longitudinal direction relative to the testing platform. The temporary positioning mechanism is connected with the control lever. The temporary positioning mechanism is configured to temporarily hold the probe platform and the control lever at a specific position. The damper is connected with the base. When a distance between the probe and the device under test along the longitudinal direction is shorter than a buffering distance, the damper at least partially abuts against the control lever or the probe platform, so as to reduce a velocity of the probe moving towards the device under test.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
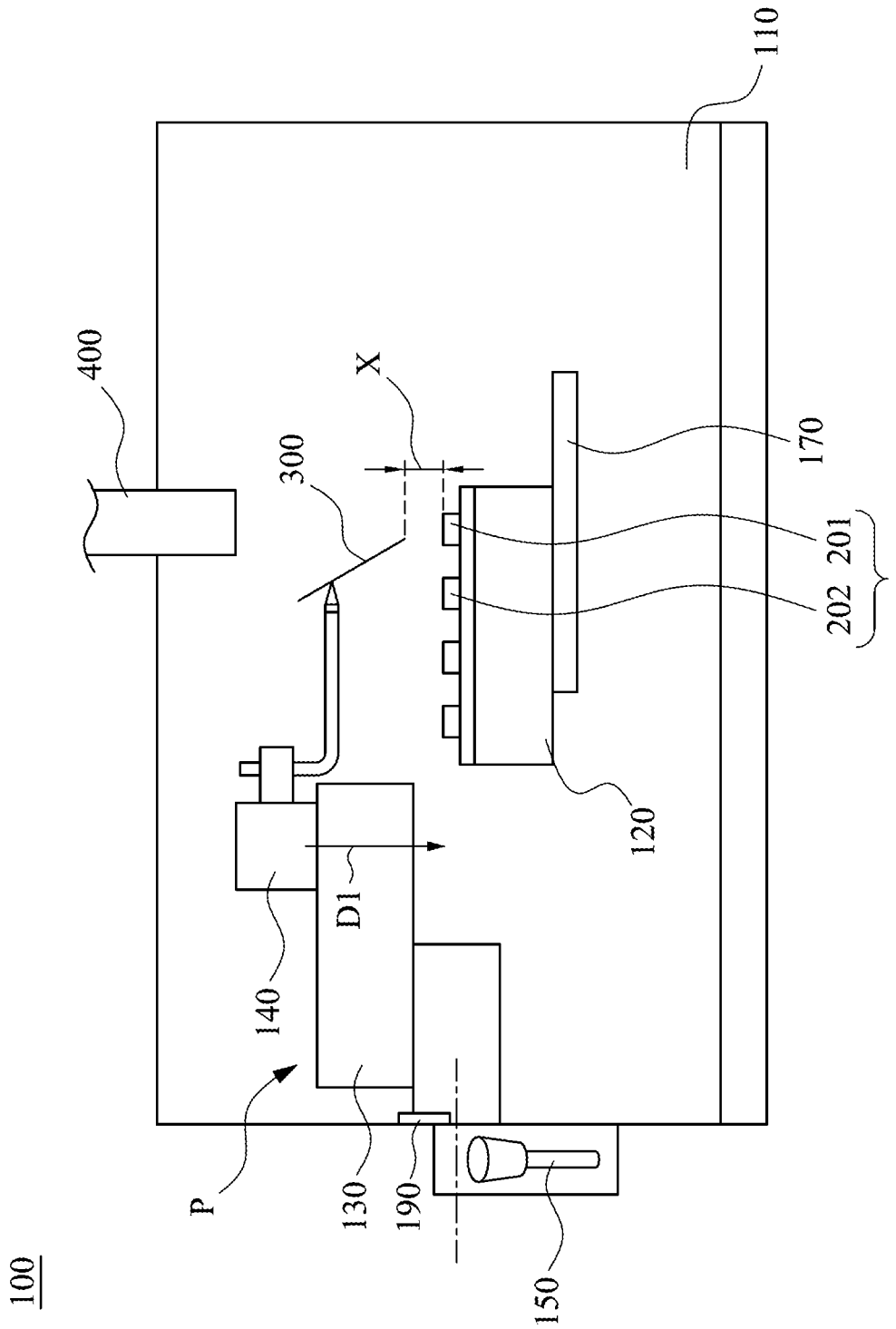
FIG. 1 is a front view of a testing machine according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
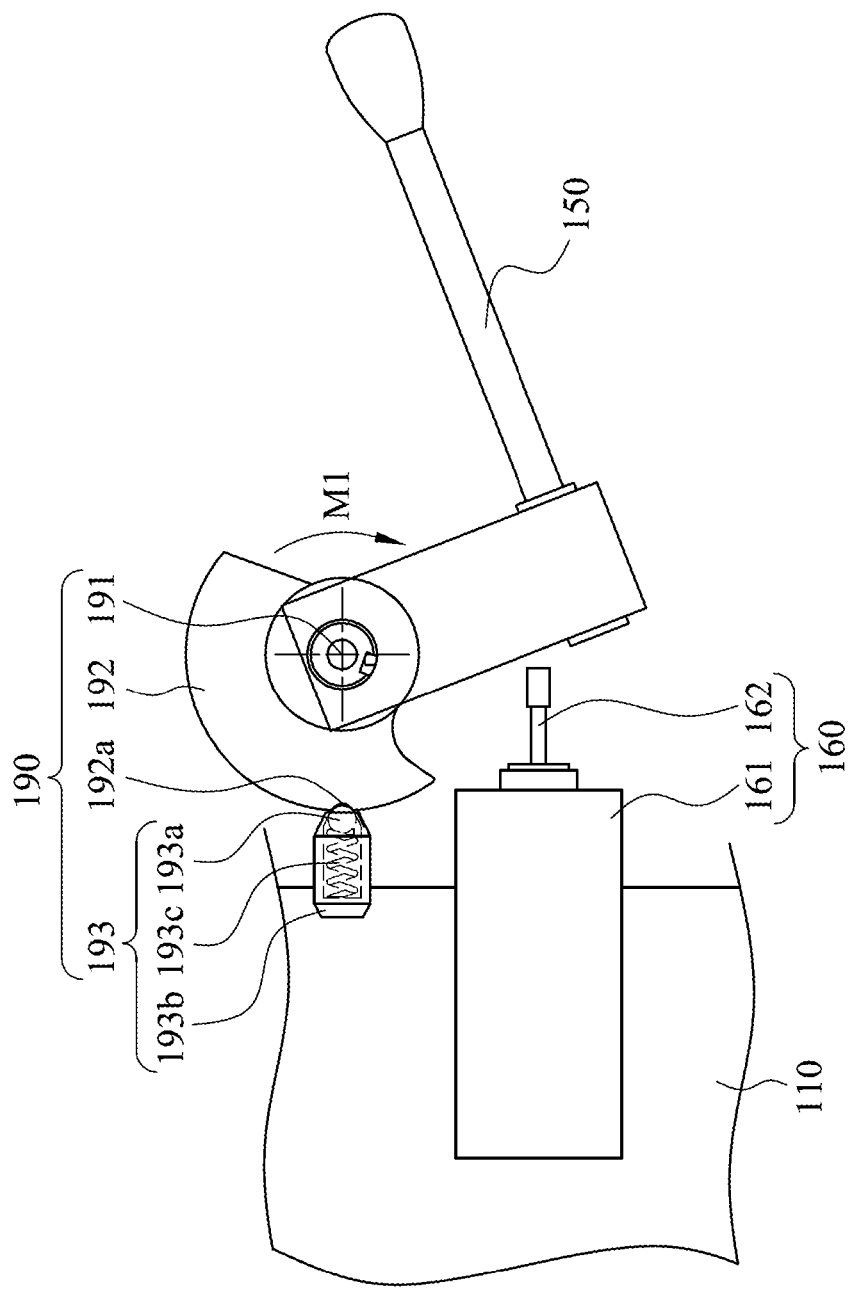
FIG. 2 is a side view of the control lever and the damper of the testing machine of FIG. 1.

Reference is made to FIGS. 1-2. FIG. 1 is a front view of a testing machine 100 according to an embodiment of the present disclosure. FIG. 2 is a side view of the control lever 150 and the damper 160 of the testing machine 100 of FIG. 1. As shown in FIGS. 1-2, a testing machine 100 includes a base 110, a testing platform 120, a probe platform 130, a control lever 150, a temporary positioning mechanism 190 and a damper 160. The testing platform 120 is connected with the base 110. The testing platform 120 is configured to carry a device under test (DUT) 200. The probe platform 130 is connected with the base 110. The probe platform 130 is able to move along a longitudinal direction D1 relative to the testing platform 120, and the probe platform 130 is configured to connect with at least one probe 300. The probe 300 corresponds to the device under test 200. The control lever 150 is connected with the base 110 and the probe platform 130. Through operating the control lever 150, the probe platform 130 is driven by the control lever 150 to move along the longitudinal direction D1 relative to the testing platform 120. The temporary positioning mechanism 190 is connected with the control lever 150. The temporary positioning mechanism 190 is configured to temporarily hold the probe platform 130 and the control lever 150 at a specific position P. The damper 160 is connected with the base 110. When a distance X between the probe 300 and the device under test 200 along the longitudinal direction D1 is shorter than a buffering distance, the damper 160 at least partially abuts against the control lever 150, so as to reduce a velocity of the probe 300 moving towards the device under test 200. In this embodiment, the testing platform 120 can be a vacuum suction cup, and the device under test 200 can be a semiconductor wafer or a light emitting diode (LED) wafer. In addition, for the sake of convenient illustration, the figures of this embodiment are not drawn in true scale. Furthermore, the temporary positioning mechanism 190 is not obvious when practically viewed from the front direction.

To be more specific, the specific position P as mentioned above, refers to a position at which the probe platform 130 and the control lever 150 temporarily locate. At the specific position P, the probe 300 does not touch the device under test 200. Afterwards, when the probe 300 moves towards the device under test 200, the distance X between the probe 300 and the device under test 200 will be reduced to a buffering distance. The distance X as mentioned above, refers to a distance along the longitudinal direction D1 between a tip of the probe 300 facing the device under test 200 and the device under test 200. The buffering distance as mentioned above, refers to a distance between the point that the probe 300 starts to decelerate since the damper 160 at least partially abuts against the control lever 150 and the point that the probe 300 slowly but precisely touches the device under test 200. To be specially illustrated, the distance X changes with the probe 300 moving towards the device under test 200. In other words, for example, the distance X is possible to be longer than or shorter than the buffering distance. The detailed illustration is revealed below.

When the temporary positioning mechanism 190 temporarily holds the probe platform 130 and the control lever 150 at the specific position P, if the user operates the control lever 150 with a force, the probe platform 130 will move towards the testing platform 120 along the longitudinal direction D1 and leave the specific position P. The temporary positioning mechanism 190 is no longer holding the probe platform 130 and the control lever 150 at the specific position P. After the probe platform 130 and the control lever 150 leave the specific position P, the user can leave the control lever 150. As driven by the self-weight of the probe platform 130 and the self-weight of the control lever 150, the probe platform 130 keep moving towards the testing platform 120 along the longitudinal direction D, until the damper 160 at least partially abuts against the control lever 150 when the distance X between the probe 300 and the device under test 200 along the longitudinal direction D is shorter than the buffering distance.

To be more specific, the buffering distance as mentioned above is a preset value. The setting of the preset valve is based on an enough distance X to allow the movement of the probe 300 towards the device under test 200 along the longitudinal direction D1 to slow down. The preferred preset value of the buffering distance is that at the moment the probe 300 touches the device under test 200, the relative velocity between the probe 300 and the device under test 200 is reduced to zero or close to zero. Thus, the probe 300 can slowly but precisely touch the device under test 200, and it is uneasy for the probe 300 and the device under test 200 to generate too heavy an impact to each other. Consequently, it is difficult to damage the probe 300 and the device under test 200 when they touch each other.

As shown in FIG. 2, the temporary positioning mechanism 190 includes a shaft 191, a rotating disc 192 and a pinball structure 193. The shaft 191 is connected with the control lever 150. The rotating disc 192 is connected with the shaft 191. The rotating disc 192 has at least one recessed portion 192a. The pinball structure 193 is connected with the base 110. A position of the pinball structure 193 corresponds with the recessed portion 192a, so as to temporarily hold a relative position between the rotating disc 192 and the pinball structure 193. When the relative position between the rotating disc 192 and the pinball structure 193 is held, the probe platform 130 and the control lever 150 are held at the specific position P, and the control lever 150 does not touch the damper 160.

Figure 3:
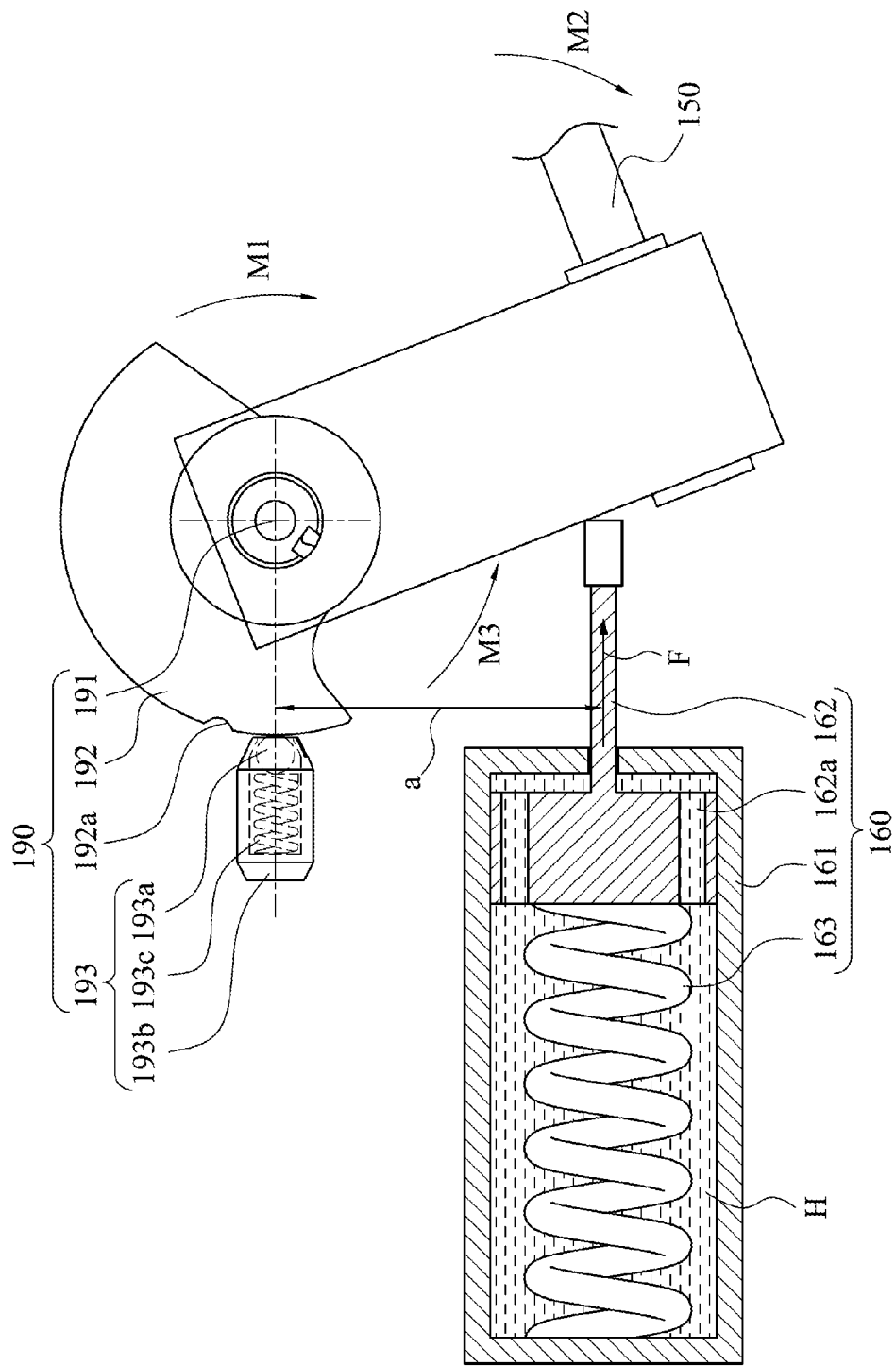
FIG. 3 is a partial cross-sectional view of the damper of FIG. 1 at least partially abutting the control lever.

Furthermore, the pinball structure 193 further includes a pinball 193a, a casing 193b and an elastic element 193c. The casing 193b is connected with the base 110. The elastic element 193c is connected with the pinball 193a and the casing 193b. The pinball 193a at least partially protrudes from the casing 193b. A position of the pinball 193a corresponds with the recessed portion 192a, so as to temporarily hold the position of the rotating disc 192, and also hold the probe platform 130 and the control lever 150 at the specific position P. When the user operates the control lever 150 with a force and makes the probe platform 130 move towards the testing platform 120 along the longitudinal direction D1 and leave the specific position P, the pinball 193a is pressed by the rotating disc 192 and moves towards the casing 193b. Since the pinball 193a moves away from the recessed portion 192a at the same time, the user can leave the control lever 150 at this point. The rotating disc 192 together with the control lever 150 can rotate relative to the pinball structure 193, as driven by the self-weight of the probe platform 130 and the self-weight of the control lever 150. In addition, after the recessed portion 192a rotates with the rotating disc 192 and leaves the pinball 193a for a distance (as shown in FIG. 3), and the distance X between the probe 300 and the device under test 200 along the longitudinal direction D1 is shorter than the buffering distance, as mentioned above, the damper 160 at least partially abuts against the control lever 150, such that the velocity of the probe 300 moving towards the device under test 200 is correspondingly reduced. Thus, the probe 300 can slowly and precisely touch the device under test 200.

On the other hand, as shown in FIGS. 1-3, the damper 160 includes a fixing portion 161 and a moving portion 162. The fixing portion 161 is connected with the base 110. The moving portion 162 is slidably connected with the fixing portion 161. When the probe platform 130 and the control lever 150 leave the specific position P and the distance X between the probe 300 and the device under test 200 along the longitudinal direction D1 is shorter than the buffering distance, the moving portion 162 at least partially abuts against the control lever 150.

Reference is made to FIG. 3. FIG. 3 is a partial cross-sectional view of the damper 160 of FIG. 1 at least partially abutting the control lever 150. Structurally speaking, as shown in FIG. 3, the moving portion 162 of the damper 160 is located at a side of the fixing portion 161 in the form of a piston. The part of the moving portion 162 in the form of a piston has a plurality of through holes 162a. The fixing portion 161 is filled up with hydraulic oil H. The hydraulic oil H can flow between the two opposite sides of the part of the moving portion 162 in the form of a piston through the through holes 162a. When the moving portion 162 abuts against the control lever 150, the moving portion 162 is compressed and the part of the moving portion 162 in the form of a piston tends to slide in the fixing portion 161. However, the hydraulic oil H instantly forms a resistance to resist the part in the form of a piston, i.e., the moving portion 162, from sliding relative to the fixing portion 161. However, as the hydraulic oil H gradually flows through the through holes 162a to the other side of the part in the form of a piston, the part in the form of a piston can slide in the fixing portion 161. This means the moving portion 162 can slide relative to the fixing portion 161, and the sliding velocity is restricted by the hydraulic oil H.

Please keep referring to FIG. 3. To be more specific, the damper 160 further includes an elastic element 163. The elastic element 163 is connected with the fixing portion 161 and the moving portion 162. When the moving portion 162 abuts against the control lever 150, the elastic element 163 is compressed to shorten, and the elastic element 163 stores an elastic potential energy. When the user operates the control lever 150 to move the control lever 150 away from the damper 160, the elastic element 163 releases the elastic potential energy stored and help to restore the compressed damper 160, which facilitates the user to life up the control lever 150. In order to achieve an effect of effective restoration, an elasticity of the elastic element 163 is larger than the resistance produced by the hydraulic oil H.

To be specially illustrated, as shown in FIG. 3, when the elastic element 163 is compressed, the elastic element 163 can drive the moving portion 162 to exert a reaction force F to the control lever 150. The reaction force F and its moment arm a relative to the control lever 150 form a third moment M3 to the control lever 150. In order to let the probe platform 130 keep moving towards the testing platform 120 along the longitudinal direction D1 after the user stops operating the control lever 150 with a force, a sum of a first moment M1 of the self-weight of the probe platform 130 exerting on the control lever 150 and a second moment M2 of a self-weight of the control lever 150, is larger than the third moment M3 of the elastic element 163 exerting on the control lever 150 when compressed. Preferably, before the probe 300 and the device under test 200 are in touch, the sum of the first moment M1 and the second moment M2 is larger than the third moment M3. Meanwhile, when the probe 300 and the device under test 200 are in touch, the sum of the first moment M1 and the second moment M2 is substantially the same as the third moment M3. In accordance with the principle that the sum of the first moment M1 and the second moment M2 is larger than the third moment M3, the sliding direction of the moving portion 162 of the damper 160 can also be configured to be along the longitudinal direction D1. Moreover, for the damper 160 chosen to be used in the present disclosure, attention has to be paid to the matching principle between the damper 160 as described above and the control lever 150.

Figure 4:
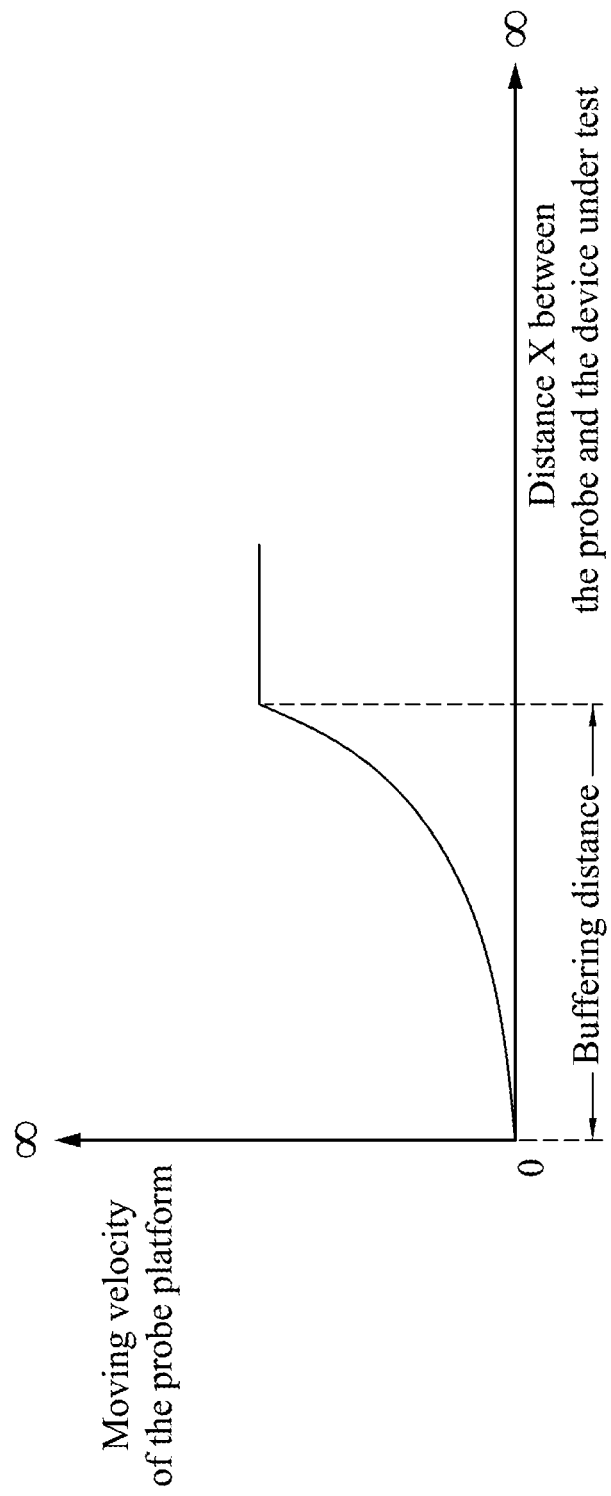
FIG. 4 is a graph of the moving velocity of the probe platform of FIG. 1 against the distance between the probe and the device under test.

Reference is made to FIG. 4. FIG. 4 is a graph of the moving velocity of the probe platform 130 of FIG. 1 against the distance between the probe 300 and the device under test 200. After the probe platform 130 and the control lever 150 leave the specific position P, as driven by the self-weight of the probe platform 130 and the self-weight of the control lever 150, the distance X between the probe 300 and the device under test 200 is gradually reduced. When the distance X is shorter than the buffering distance, the damper 160 at least partially abuts against the control lever 150. With the buffering mechanism of the damper 160 as mentioned above, the resistance to the moving portion 162 and the velocity at which the damper 160 shortens as compressed form a relation as a curve. As a result, as shown in FIG. 4, the closer the probe 300 moves to the device under test 200, the slower the moving velocity of the probe platform 130. Preferably, the moving velocity is close to zero when the probe 300 closely approaches the device under test 200 and is substantially equal to zero when the probe 300 contacts the device under test 200. It is worth noting that, when the probe platform 130 and the control lever 150 are held at the specific position P, the distance X between the probe 300 and the device under test 200 can be shorter than the buffering distance. In other words, when the probe platform 130 and the control lever 150 are held at the specific position P, the damper 160 has already at least partially abutted against the control lever 150. Moreover, in other embodiments, the rotating disc 192 can have a plurality of recessed portions 192a, such that the probe platform 130 and the control lever 150 can be held at a plurality of specific positions P. The specific positions P include various positions such that the distance X between the probe 300 and the device under test 200 can be larger than, equal to, or shorter than the buffering distance.

As compared to mechanisms using friction to decelerate, i.e., exerting a frictional force to the probe platform 130 and/or the control lever 150, so as to compensate the force to the probe platform 130 and the control lever 150 as driven by the self-weight of the probe platform 130 and the self-weight of the control lever 150. Since the magnitude of a frictional force is directly proportional to the normal force acting on the frictional surface of the probe platform 130 and/or the control lever 150, and is independent of the moving velocity of the probe platform 130 and/or the control lever 150 relative to the frictional surface, for example, when the probe platform 130 and the control lever 150 are driven to move by the self-weight of the probe platform 130 and the self-weight of the control lever 150, and the force of the movement of the probe platform 130 and the control lever 150 overcomes the frictional force, the probe platform 130 and the control lever 150 will accelerate under the force difference between the force of the movement and the frictional force. As a result, the moving velocity of the probe platform 130 and the control lever 150 cannot be reduced. Thus, it is difficult for the probe 300 to slowly but precisely touch the device under test 200. Even if the force of movement of the control lever 150 is just overcome by the frictional force, the probe platform 130 and the control lever 150 will still move in a constant velocity. In this situation, it is also difficult for the probe 300 to slowly but precisely touch the device under test 200. On the contrary, since a buffering effect provided the damper 160 adopted in the present disclosure is related to the moving velocity of the control lever 150 and the probe platform 130, the damper 160 can effectively decelerate the control lever 150 and the probe platform 130, such that the velocity at which the probe 300 moves close to the device under test 200 is correspondingly reduced. Consequently, the probe 300 can slowly but precisely touch the device under test 200.

In this embodiment, it is preferred that the damper 160 is a one-way damper. The reason to use a one-way damper is that when the testing of the device under test 200 is finished, since the time of testing is determined by the user, the user is required to lift up the control lever 150 by manual operation (taking this embodiment as an example and is not limiting the present disclosure), until the temporary positioning mechanism 190 temporarily holds the probe platform 130 and the control lever 150 again at the specific position P. Since the damper 160 is a one-way damper, the force required to lift up the control lever 150 will not be affected by the resistance of the damper 160. Thus, it is easy for the user to lift up the control lever 150. As compared to the mechanism to decelerate by frictional force, especially when a control lever with a larger frictional force is used, apart from the difficulty to let the probe 300 to slowly and precisely touch the device under test 200 after overcoming the frictional force, the frictional force will become a resistance instead when the user lifts up the control lever after the test is finished. Thus, it is uneasy for the control lever to restore to the original position.

Please go back to FIG. 1. When the probe platform 130 is located at the specific position P, the temporary positioning mechanism 190 temporarily holds the probe platform 190 and the control lever 150 at the specific position P. In practical applications, the device under test 200 further includes a plurality of subsidiary devices under test. For illustration, the first subsidiary device under test 201 and second subsidiary device under test 202 are used as examples in this embodiment. However, since the volumes of the first subsidiary device under test 201 and the second subsidiary device under test 202 are small in general, the user can use a microscope 400 to confirm the position of the first subsidiary device under test 201 before the operation of the control lever 150.

Generally speaking, when a wafer is first tested, a regulator 140 is used to let the probe 300 to touch the device under test 200 on the wafer, so as to confirm the distance between the probe 300 and the device under test 200. In the tests afterwards, provided that a surface of the device under test 200 is flat and there is no other issue, the user does not need to adjust the regulator 140 again, as explained below. To be specially illustrated, the ways of testing as described below are mainly based on the situation that no adjustment for the regulator 140 is required after the first adjustment.

Figure 5:
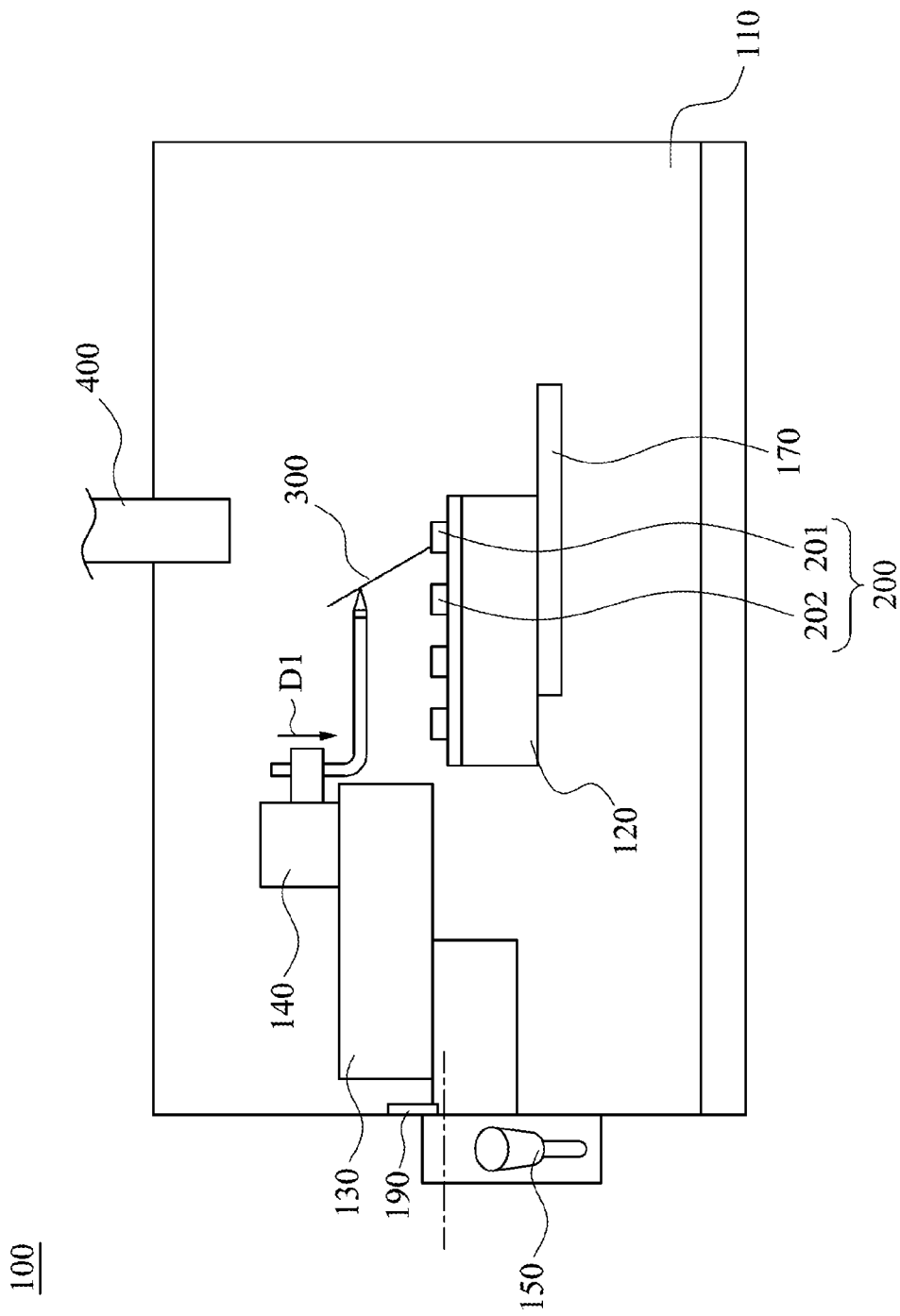
FIG. 5 is a front view of the testing machine of FIG. 1, in which the probe touches the first subsidiary device under test.

Please keep referring to FIG. 1 and FIG. 5. FIG. 5 is a front view of the testing machine 100 of FIG. 1, in which the probe 300 touches the first subsidiary device under test 201. When a wafer is to be first tested, and the probe platform 130 is located at the specific position P, the user operates the control lever 150 with a force to move the probe platform 130 towards the testing platform 120 along the longitudinal direction D1 and to leave the specific position P. At this point, the probe platform 130 keeps moving towards the testing platform 120 along the longitudinal direction D1 as driven by the self-weight of the probe platform 130 and the self-weight of the control lever 150. When the distance X between the probe 300 and the device under test 200 along the longitudinal direction D1 is shorter than the buffering distance, the damper 160 abuts against the control lever 150, such that the moving velocity of the probe 300 towards the first subsidiary device under test 201 is reduced. At this point, the probe 300 has not yet touched the first subsidiary device under test 201. Consequently, as shown in FIG. 1 and FIG. 5, the probe platform 130 further includes the regulator 140. The regulator 140 is connected with the probe 300 and is configured to adjust and obtain the distance between the probe 300 and the device under test 200. In other words, in case a wafer is first tested, when the damper 160 is shortened to the minimum stroke and the probe 300 has not yet touched the first subsidiary device under test 201, as shown in FIG. 5, the user can make the probe 300 touch the first subsidiary device under test 201 by adjusting the regulator 140. This means the distance X between the probe 300 and the first subsidiary device under test 201 is equal to zero (distance X is not shown in FIG. 5). At this point, the user has obtained the distance between the probe 300 and the rest of the subsidiary devices under test, and test can be carried out to the first subsidiary device under test 201 by the probe 300.

Figure 6:
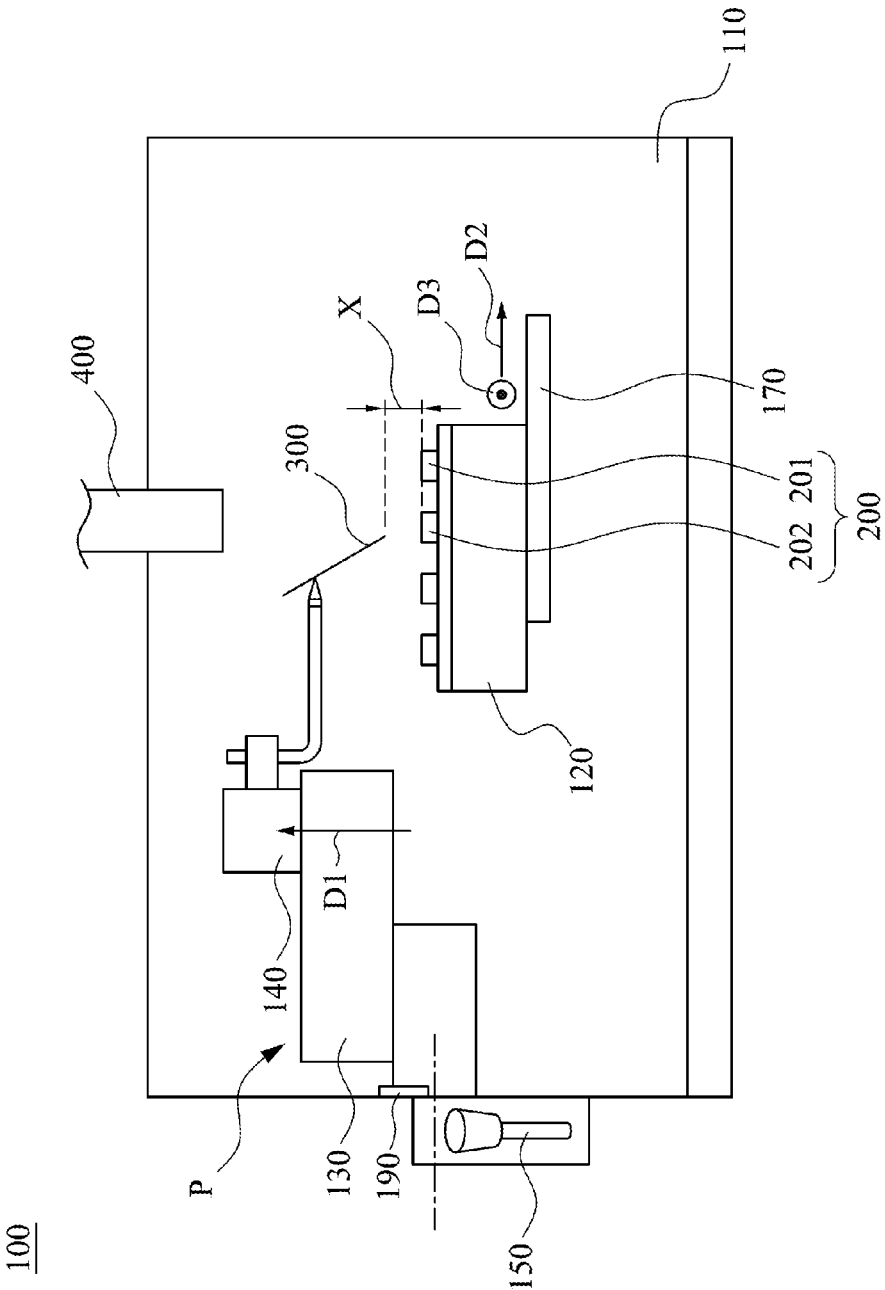
FIG. 6 is a front view of the testing machine of FIG. 1, in which the probe platform moves back to the specific position.

Reference is made to FIG. 6. FIG. 6 is a front view of the testing machine 100 of FIG. 1, in which the probe platform 130 moves back to the specific position P. As shown in FIG. 6, after the test of the first subsidiary device under test 201 by the probe 300 is finished, the user can operate the control lever 150 to move the probe platform 130 back to the specific position P along the longitudinal direction D1, such that the probe 300 leaves the first subsidiary device under test 201 along the longitudinal direction D1 and the distance X between the probe 300 and the first subsidiary device under test 201 appears again. Since the regulator 140 has already been adjusted for the distance that the probe 300 tends to touch the device under test 200, the distance X at this moment is shorter than the original distance X, i.e., shorter than the distance X in FIG. 1.

Consequently, the user adjusts the testing platform 120 so as to aim the second subsidiary device under test 202 to the probe 300. As shown in FIG. 6, the testing machine 100 further includes a planar moving mechanism 170. The planar moving mechanism 170 is configured to drive the testing platform 120 to move along a plane relative to the base 110, i.e., move along the first direction D2 and the second direction D3 (the second direction D3 is the direction enters into FIG. 6 or comes out from FIG. 6) of FIG. 6. The plane (i.e., the first direction D2 and the second direction D3) and the longitudinal direction D1 are substantially orthogonal, and substantially parallel with the testing platform 120. In this embodiment, the first direction D2 and the second direction D3 are mutually perpendicular with the longitudinal direction D1. When the test to the first subsidiary is finished, and the distance X appears again between the probe 300 and the device under test 200, the user can adjust the testing platform 120 so as to aim the second subsidiary device under test 202 to the probe 300, which means to aim the probe 300 to the second subsidiary device under test 202.

Figure 7:
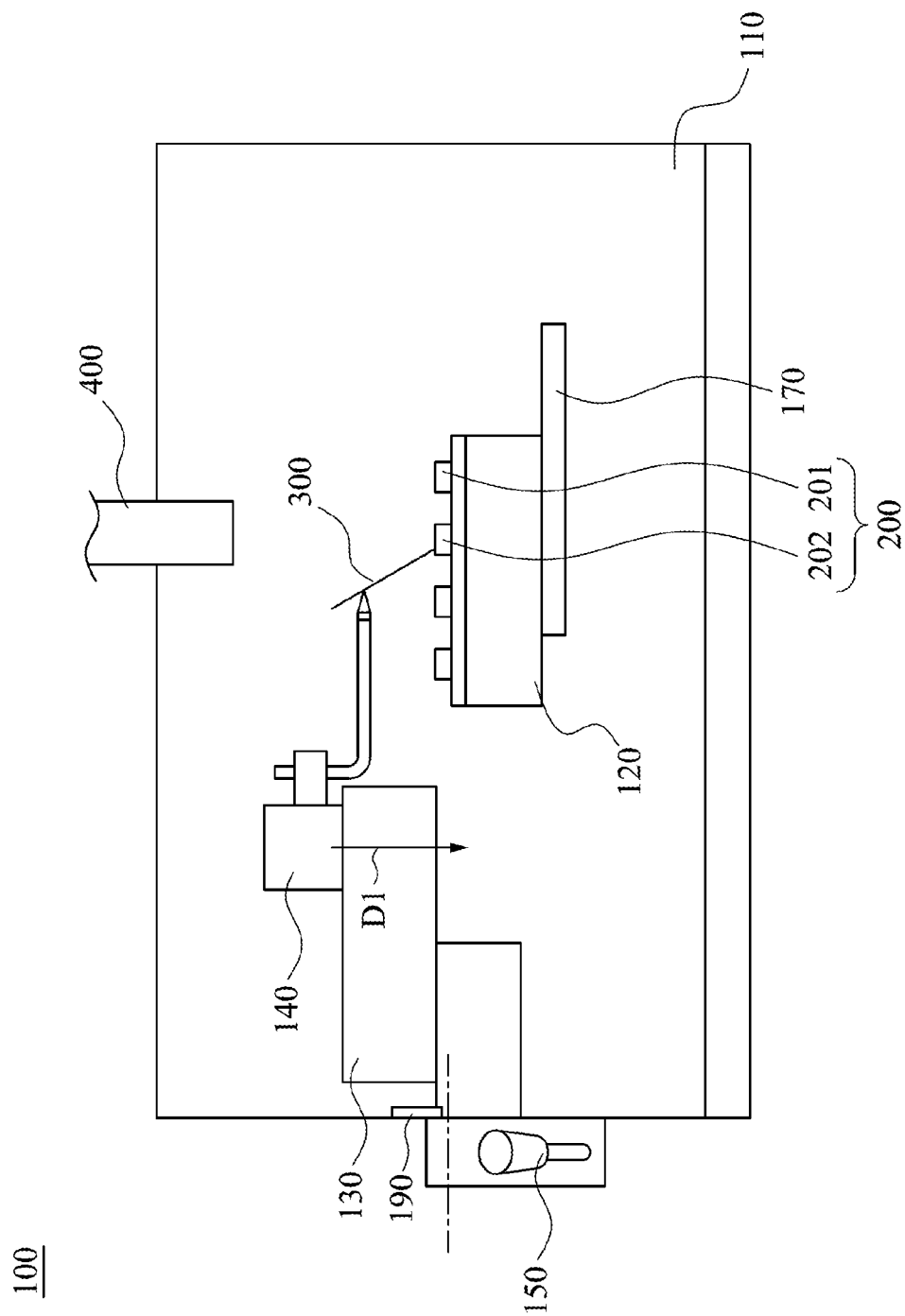
FIG. 7 is a front view of the testing machine of FIG. 1, in which the probe touches the second subsidiary device under test.

Reference is made to FIG. 7. FIG. 7 is a front view of the testing machine 100 of FIG. 1, in which the probe 300 touches the second subsidiary device under test 202. After the probe 300 is aimed to the second subsidiary device under test 202, the user can operate the control lever 150 to make the probe platform 130 move towards the testing platform 120 along the longitudinal direction D1 again and leave the specific position P. At this point, the pinball 193a of the pinball structure 193 (please refer to FIG. 3) is pressed by the rotating disc 192 and moves towards the casing 193b. Since the pinball 193a moves away from the recessed portion 192a, the user can leave the control lever 150 at this point. The rotating disc 192 together with the control lever 150 can rotate relative to the pinball structure 193, as driven by the self-weight of the probe platform 130 and the self-weight of the control lever 150. When the distance X between the probe 300 and the device under test 200 along the longitudinal direction D1 is shorter than the buffering distance, the damper 160 at least partially abuts against the control lever 150. Since the sliding velocity of the moving portion 162 of the damper 160 relative to the fixing portion 161 is restricted by the hydraulic oil H, the moving velocity of the probe platform 130 towards the testing platform 120 along the longitudinal direction D1 is correspondingly restricted and reduced, such that the velocity of the probe 300 moving towards the second subsidiary device under test 202 is consequently reduced. Thus, the probe 300 can slowly but precisely touch the second subsidiary device under test 202, and it is difficult for the probe 300 and the second subsidiary device under test 202 to generate too heavy an impact to each other. Consequently, it is difficult to damage the probe 300 and the device under test 200 when they touch each other. As shown in FIG. 7, the probe 300 and the second subsidiary device under test 202 touch each other, i.e., the distance X between the probe 300 and the second subsidiary device under test 202 is equal to zero (distance X is not shown in FIG. 7).

It is appreciated that the sequence of the steps and the sub-steps as mentioned above, unless otherwise specified, can all be adjusted upon the actual situations, or even executed at the same time or partially at the same time.

Figure 8:
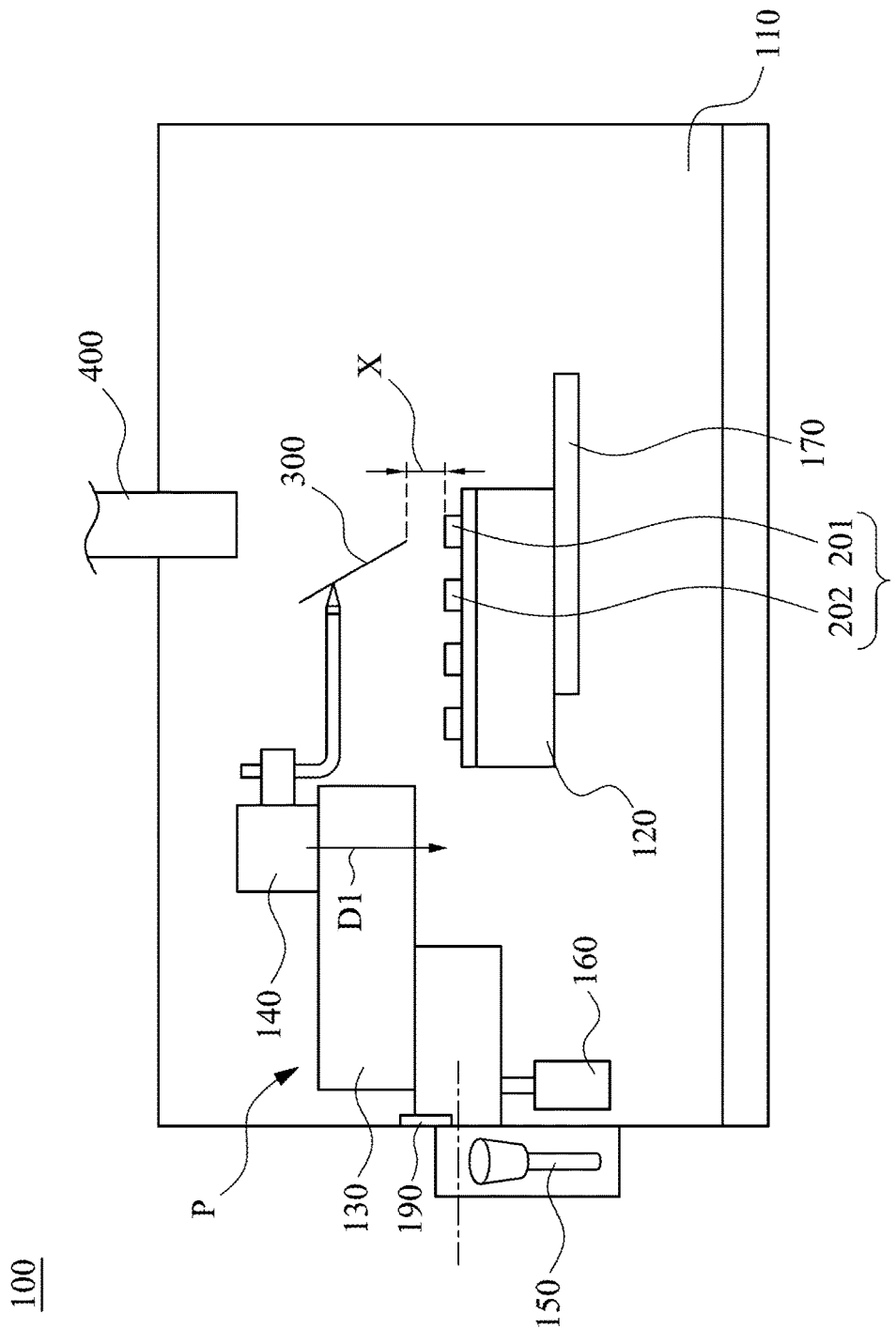
FIG. 8 is a front view of a testing machine according to another embodiment of the present disclosure.

Reference is made to FIG. 8. FIG. 8 is a front view of a testing machine 100 according to another embodiment of the present disclosure. In this embodiment, the damper 160 is connected with the base 110, and is configured to at least partially abut against the probe platform 130, so as to reduce a velocity of the probe 300 moving towards the device under test 200. To be more specific, as shown in FIG. 8, the damper 160 is located under the probe platform 130, i.e., on the route of the probe 130 moving towards the testing platform 120 along the longitudinal direction D1. Moreover, the direction that the damper 160 is compressed and shortened, is the same as the longitudinal direction D1.

Similarly, when the temporary positioning mechanism 190 temporarily holds the probe platform 130 and the control lever 150 at the specific position P, if the user operates the control lever 150 with a force, the probe platform 130 will move towards the testing platform 120 along the longitudinal direction D1 and leave the specific position P. The temporary positioning mechanism 190 is no longer holding the probe platform 130 and the control lever 150 at the specific position P. After the probe platform 130 and the control lever 150 leave the specific position P, the user can leave the control lever 150. As driven by the self-weight of the probe platform 130 and the self-weight of the control lever 150, the probe platform 130 keep moving towards the testing platform 120 along the longitudinal direction D, until the damper 160 under the probe platform 130 at least partially abuts against the probe platform 130 directly when the distance X between the probe 300 and the device under test 200 along the longitudinal direction D is shorter than the buffering distance.

Since the damper 160 under the probe platform 130 at least partially abuts against the probe platform 130 directly, the velocity at which the probe 300 moves towards the device under test 200 is correspondingly reduced. Consequently, the probe 300 can slowly but precisely touch the device under test 200.

In conclusion, when compared with the prior art, the embodiments of the present disclosure mentioned above have at least the following advantages:

(1) When the distance between the probe and the device under test along the longitudinal direction is shorter than the buffering distance, the damper at least partially abuts against the control lever, so as to reduce a velocity of the probe moving towards the device under test. Therefore, the probe can slowly but precisely touch the device under test, and it is difficult for the probe and the device under test to generate too heavy an impact to each other. Consequently, it is difficult for the probe and the device under test to be damaged when they may touch each other.

(2) The embodiments mentioned above of the present disclosure use the elastic element to connect with the fixing portion and the moving portion of the damper. Thus, when the moving portion abuts against the control lever, the elastic element is compressed to shorten, and the elastic element stores an elastic potential energy. When the control lever moves away from the damper, the elastic element releases the elastic potential energy stored and help to restore the compressed damper.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A testing machine comprising:
   a base;
   a testing platform connected with the base, the testing platform being configured to carry a device under test;
   a probe platform connected with the base, the probe platform being able to move along a longitudinal direction relative to the testing platform, and the probe platform being configured to connect with at least one probe corresponding to the device under test;
   a control lever connected with the base and the probe platform, through operating the control lever, the probe platform being driven by the control lever to move along the longitudinal direction relative to the testing platform;
   a temporary positioning mechanism connected with the control lever, the temporary positioning mechanism being configured to temporarily hold the probe platform and the control lever at a specific position; and
   a damper connected with the base, wherein when a distance between the probe and the device under test along the longitudinal direction is shorter than a buffering distance, the damper at least partially abuts against the control lever or the probe platform, so as to reduce a velocity of the probe moving towards the device under test;
   wherein the buffering distance is a distance between a first point that the probe starts to decelerate since the damper at least partially abuts against the control lever and a second point that the probe touches the device under test.

2. The testing machine of claim 1, wherein the damper includes:
   a fixing portion connected with the base; and
   a moving portion slidably connected with the fixing portion, wherein when the probe platform and the control lever leave the specific position and the distance between the probe and the device under test along the longitudinal direction is shorter than the buffering distance, the moving portion at least partially abuts against the control lever.

3. The testing machine of claim 2, wherein the damper comprises:

an elastic element connected with the fixing portion and the moving portion, wherein when the moving portion abuts against the control lever, the elastic element is compressed to shorten.

4. The testing machine of claim 3, wherein a sum of a first moment of a self-weight of the probe platform exerting on the control lever and a second moment of a self-weight of the control lever, is larger than a third moment of the elastic element exerting on the control lever when compressed, such that the probe platform keeps moving towards the testing platform along the longitudinal direction after an operation of the control lever stops.

5. The testing machine of claim 1, wherein the damper is a one-way damper.

6. The testing machine of claim 1, further comprising:
a planar moving mechanism configured to drive the testing platform to move along a plane relative to the base, the plane and the longitudinal direction are substantially orthogonal.

7. The testing machine of claim 1, wherein the temporary positioning mechanism comprises:
a shaft connected with the control lever;
a rotating disc connected with the shaft, the rotating disc has at least one recessed portion; and
a pinball structure connected with the base, and a position of the pinball structure corresponds with the recessed portion, so as to temporarily hold a relative position between the rotating disc and the pinball structure.

8. The testing machine of claim 7, wherein the pinball structure comprises:
a pinball;
a casing connected with the base; and
an elastic element connected with the pinball and the casing, the pinball at least partially protrudes from the casing, and a position of the pinball corresponds with the recessed portion.

9. The testing machine of claim 1, wherein when the distance is shorter than the buffering distance, the closer the probe moves to the device under test, the slower the moving velocity of the probe.

10. An operating method of a testing machine, the operating method comprising:
holding temporarily a probe platform and a control lever at a specific position by a temporary positioning mechanism;
operating the control lever with a force to move the probe platform towards a testing platform along a longitudinal direction;
stopping operating the control lever with the force when the probe platform and the control lever leave the specific position, such that the probe platform moves towards the testing platform according to a self-weight of the probe platform and a self-weight of the control lever; and
abutting the control lever with a damper after the probe platform and the control lever leave the specific position and when a distance between a probe disposed on the probe platform and a device under test along the longitudinal direction is shorter than a buffering distance, such that the probe platform and the control lever compress the damper, so as to reduce the velocity of the probe moving towards the device under test, wherein the buffer distance is a distance between a first point that the probe starts to decelerate since the damper at least partially abuts against the control lever and a second point that the probe touches the device under test.

11. The operation method of claim 10, further comprises:
operating the control lever to move the control lever away from the damper; and
restoring the compressed damper.

12. An operating method of a testing machine, the operating method comprising:
holding temporarily a probe platform at a specific position by a temporary positioning mechanism;
operating a control lever to move the probe platform towards a testing platform along a longitudinal direction; and
compressing a damper when a distance between a probe disposed on the probe platform and a device under test along the longitudinal direction is shorter than a buffering distance so as to reduce the velocity of the probe moving towards the device under test, wherein the buffering distance is a distance between a first point that the probe starts to decelerate since the damper at least partially abuts against the control lever and a second point that the probe touches the device under test.

13. The operation method of claim 12, wherein when the distance is shorter than the buffering distance, the closer the probe moves to the device under test, the slower the moving velocity of the probe.

14. The operation method of claim 13, wherein when the probe contacts the device under test, the moving velocity of the probe is substantially equal to zero.

* * * * *